(12) United States Patent
Hayakawa et al.

(10) Patent No.: US 10,134,766 B2
(45) Date of Patent: Nov. 20, 2018

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Masahiko Hayakawa, Atsugi (JP); Yuta Moriya, Isehara (JP); Junya Goto, Isehara (JP); Yasuyuki Arai, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/292,544

(22) Filed: Oct. 13, 2016

(65) Prior Publication Data

US 2017/0033129 A1 Feb. 2, 2017

Related U.S. Application Data

(63) Continuation of application No. 13/357,032, filed on Jan. 24, 2012, now Pat. No. 9,494,829.

(30) Foreign Application Priority Data

Jan. 28, 2011 (JP) ................................ 2011-017082

(51) Int. Cl.
*H01L 27/12* (2006.01)
*G02F 1/1339* (2006.01)
(Continued)

(52) U.S. Cl.
CPC ........ *H01L 27/1225* (2013.01); *G02F 1/1339* (2013.01); *G02F 1/13454* (2013.01);
(Continued)

(58) Field of Classification Search
CPC .................... G02F 1/1339; H01L 27/12257
(Continued)

(56) References Cited

U.S. PATENT DOCUMENTS

| 5,517,344 A | 5/1996 | Hu et al. |
| 5,606,194 A | 2/1997 | Lebrun et al. |

(Continued)

FOREIGN PATENT DOCUMENTS

| EP | 1737044 A | 12/2006 |
| EP | 1770788 A | 4/2007 |

(Continued)

OTHER PUBLICATIONS

Kamiya.T et al., "Carrier transport properties and electronic structures of amorphous oxide semiconductors: the present status", Solid State Physics, Sep. 1, 2009, vol. 44, No. 9, pp. 621-633, Agne Gijutsu Center.

(Continued)

*Primary Examiner* — Edmond Lau
(74) *Attorney, Agent, or Firm* — Robinson Intellectual Property Law Office; Eric J. Robinson

(57) ABSTRACT

The number of photolithography steps used for manufacturing a transistor is reduced to less than the conventional one and a highly reliable semiconductor device is provided. The present invention relates to a semiconductor device including a circuit including a transistor having an oxide semiconductor layer over a first substrate and a second substrate fixed to the first substrate with a sealant. A closed space surrounded by the sealant, the first substrate, and the second substrate is in a reduced pressure state or filled with dry air. The sealant surrounds at least the transistor and has a closed pattern shape. Further, the circuit is a driver circuit including a transistor having an oxide semiconductor layer.

6 Claims, 9 Drawing Sheets

(51) Int. Cl.
  *G02F 1/1345* (2006.01)
  *G02F 1/136* (2006.01)
  *G02F 1/1362* (2006.01)
  *G09G 3/36* (2006.01)

(52) U.S. Cl.
  CPC .. *H01L 27/127* (2013.01); *G02F 2001/13606* (2013.01); *G02F 2001/136231* (2013.01); *G09G 3/3648* (2013.01); *G09G 2300/04* (2013.01); *H01L 2224/05572* (2013.01); *H01L 2924/00014* (2013.01)

(58) Field of Classification Search
  USPC .................................................. 349/43, 153
  See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,236,444 B1 | 5/2001 | Konuma et al. | |
| 6,294,274 B1 | 9/2001 | Kawazoe et al. | |
| 6,496,240 B1 | 12/2002 | Zhang et al. | |
| 6,563,174 B2 | 5/2003 | Kawasaki et al. | |
| 6,727,522 B1 | 4/2004 | Kawasaki et al. | |
| 6,980,275 B1 | 12/2005 | Konuma et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,426,008 B2 | 9/2008 | Yamazaki et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,525,629 B2 | 4/2009 | Konuma et al. | |
| 7,674,650 B2 | 3/2010 | Akimoto et al. | |
| 7,732,819 B2 | 6/2010 | Akimoto et al. | |
| 7,910,490 B2 | 3/2011 | Akimoto et al. | |
| 7,932,521 B2 | 4/2011 | Akimoto et al. | |
| 8,247,250 B2 | 8/2012 | Kubota et al. | |
| 8,274,077 B2 | 9/2012 | Akimoto et al. | |
| 8,318,551 B2 | 11/2012 | Akimoto et al. | |
| 8,466,463 B2 | 6/2013 | Akimoto et al. | |
| 8,629,069 B2 | 1/2014 | Akimoto et al. | |
| 8,634,050 B2 | 1/2014 | Yamazaki et al. | |
| 8,669,550 B2 | 3/2014 | Akimoto et al. | |
| 8,790,959 B2 | 7/2014 | Akimoto et al. | |
| 8,796,069 B2 | 8/2014 | Akimoto et al. | |
| 9,099,562 B2 | 8/2015 | Akimoto et al. | |
| 2001/0046027 A1 | 11/2001 | Tai et al. | |
| 2001/0048502 A1 | 12/2001 | Moon et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2005/0248713 A1 | 11/2005 | Hirosue et al. | |
| 2005/0270438 A1* | 12/2005 | Konuma | G02F 1/1339 349/59 |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1* | 6/2008 | Lee | H01L 29/7869 257/43 |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0308805 A1 | 12/2008 | Akimoto et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0184911 A1 | 7/2009 | Fukutome | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0163865 A1* | 7/2010 | Arai | H01L 27/1225 257/43 |
| 2010/0165280 A1 | 7/2010 | Ishitani et al. | |
| 2010/0301329 A1* | 12/2010 | Asano | H01L 27/1214 257/43 |
| 2011/0104851 A1 | 5/2011 | Akimoto et al. | |
| 2011/0121290 A1 | 5/2011 | Akimoto et al. | |
| 2014/0132908 A1 | 5/2014 | Yamazaki et al. | |
| 2015/0340513 A1 | 11/2015 | Akimoto et al. | |

FOREIGN PATENT DOCUMENTS

| | | |
|---|---|---|
| EP | 1995787 A | 11/2008 |
| EP | 1998373 A | 12/2008 |
| EP | 1998374 A | 12/2008 |
| EP | 1998375 A | 12/2008 |

(56) References Cited

FOREIGN PATENT DOCUMENTS

| | | |
|---|---|---|
| EP | 2226847 A | 9/2010 |
| JP | 60-198861 A | 10/1985 |
| JP | 62-251723 A | 11/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-092475 A | 4/1995 |
| JP | 08-500910 | 1/1996 |
| JP | 08-264794 A | 10/1996 |
| JP | 09-269511 A | 10/1997 |
| JP | 11-084424 A | 3/1999 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2004-295109 A | 10/2004 |
| JP | 2007-171942 A | 7/2007 |
| JP | 2009-260378 A | 11/2009 |
| JP | 2010-157702 A | 7/2010 |
| KR | 2010-0094275 A | 8/2010 |
| WO | WO-2004/114391 | 12/2004 |
| WO | WO-2007/060901 | 5/2007 |
| WO | WO-2010/064590 | 6/2010 |

OTHER PUBLICATIONS

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White TANDEM OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Sold-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-118.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

(56) References Cited

OTHER PUBLICATIONS

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by PEALD Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AMOLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B. (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using CASTEP", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers", J. Electrochem. Soc. (Journal of The Electrochemical Society), 2008, vol. 155, No. 12, pp. H1009-H1014.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Korean Office Action (Application No. 2012-0007727) dated Jun. 4, 2018.

* cited by examiner

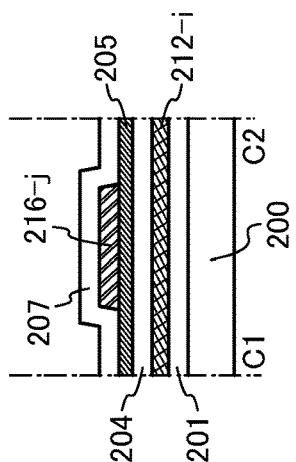
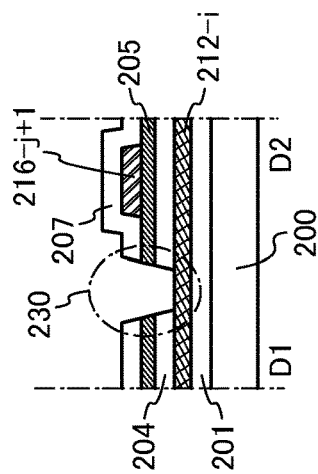
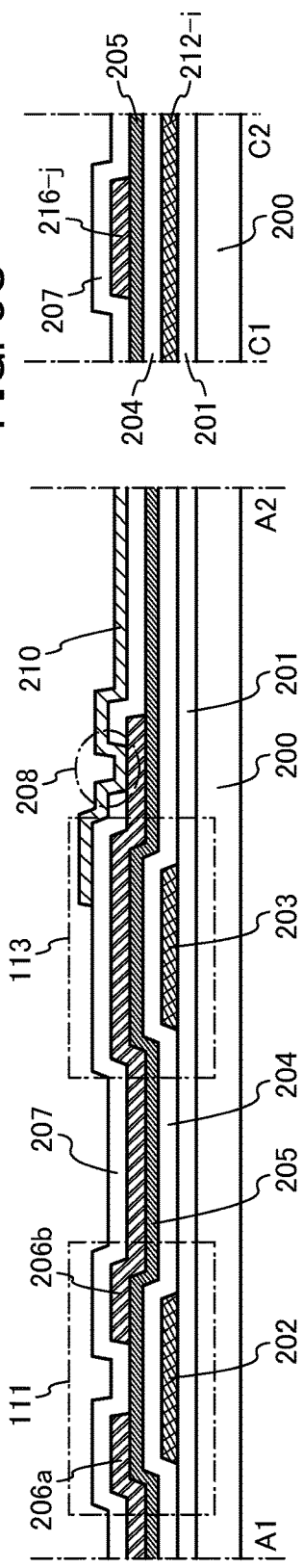
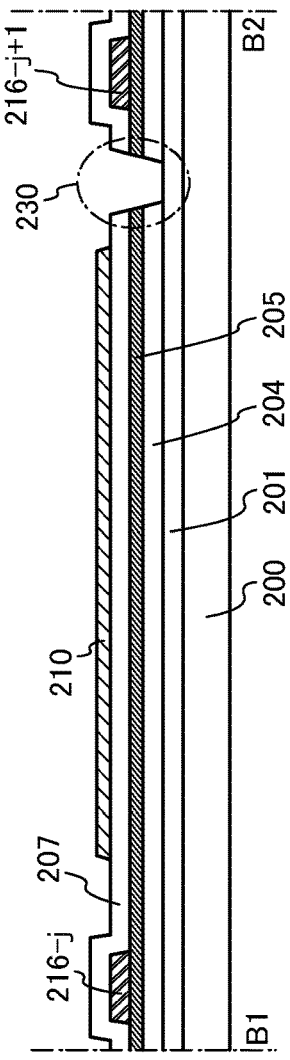
FIG. 3A
FIG. 3B
FIG. 3C
FIG. 3D

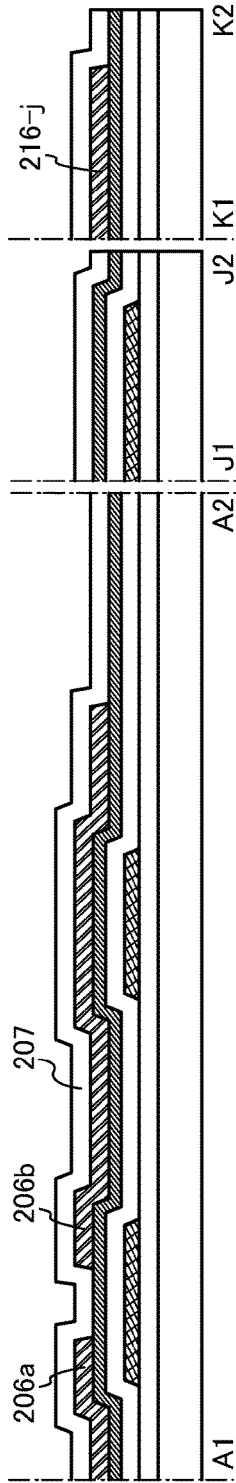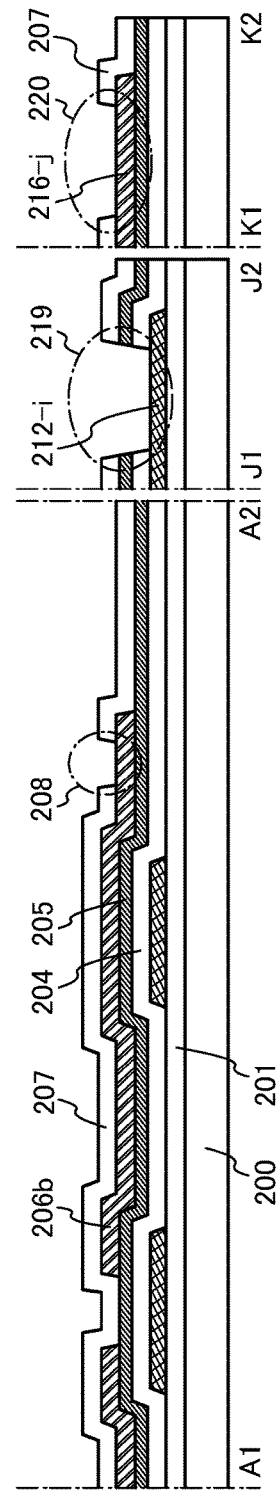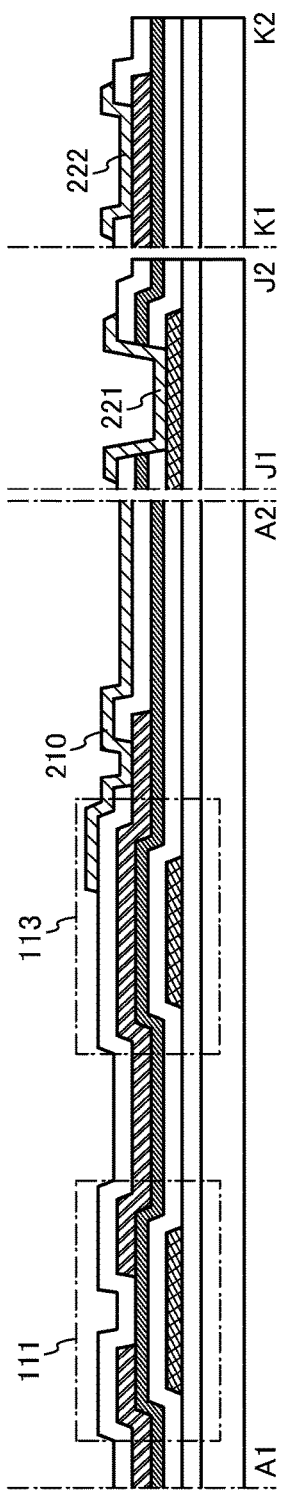

FIG. 6A1
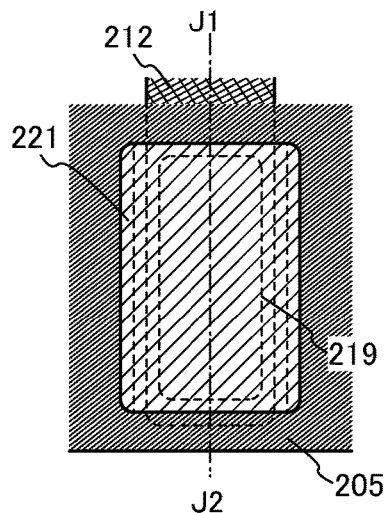
FIG. 6A2
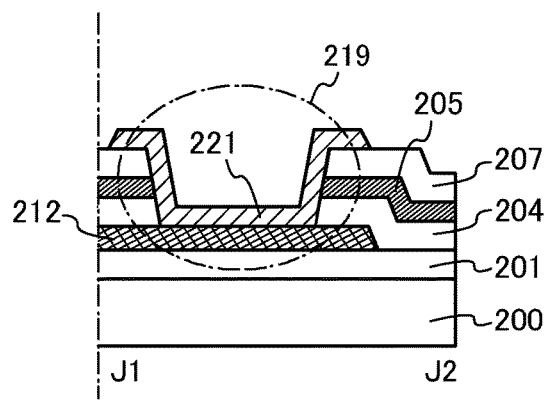
FIG. 6B1
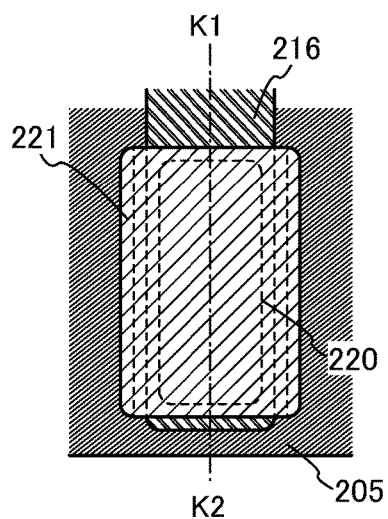
FIG. 6B2
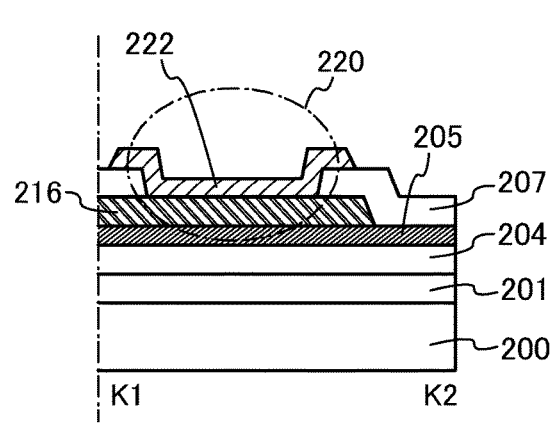

SEMICONDUCTOR DEVICE AND METHOD FOR MANUFACTURING THE SAME

BACKGROUND OF THE INVENTION

1. Field of the Invention

The present invention relates to a semiconductor device including an oxide semiconductor and a manufacturing method thereof.

In this specification, a semiconductor device generally means a device which can function by utilizing semiconductor characteristics, and an electrooptic device, a semiconductor circuit, and electronic equipment are all semiconductor devices.

2. Description of the Related Art

In recent years, transistors that are formed using a semiconductor thin film having a thickness of about several nanometers to several hundreds of nanometers over a substrate having an insulating surface such as a glass substrate have been attracting attention. Transistors are widely used for electronic devices such as ICs (integrated circuits) and electrooptic devices. In particular, transistors are urgently developed as switching elements of image display devices typified by liquid crystal display devices and the like.

Further, transistors in which a channel formation region is formed using a metal oxide having semiconductor characteristics (hereinafter also referred to as an "oxide semiconductor") are already known.

Transistors are roughly classified into a top-gate type in which a channel formation region is provided below a gate electrode and a bottom-gate type in which a channel formation region is provided above a gate electrode. These transistors are generally manufactured using at least five photomasks.

Further, in order to improve reliability, a liquid crystal display device in which a sensor portion is sealed with a sealing portion doubly is disclosed in Patent Document 1.

REFERENCE

Patent Document

[Patent Document 1] Japanese Published Patent Application No. H11-84424

SUMMARY OF THE INVENTION

An object of one embodiment of the present invention is to reduce the number of photolithography steps used for manufacturing a transistor as compared to a conventional technique and provide a highly reliable semiconductor device.

A transistor including an oxide semiconductor layer as a channel formation region (hereinafter referred to as an "oxide semiconductor transistor") is sometimes affected by the atmosphere, and for example, when the atmosphere is at high temperature and high humidity, variation in the characteristics may be caused.

In particular, in the case where the oxide semiconductor layer of the oxide semiconductor transistor is not covered with a protective film sufficiently, variation in the characteristics is easily caused.

To reduce the number of photolithography steps to less than the conventional one, it is necessary to skip the step of etching the oxide semiconductor layer. When the step of etching the oxide semiconductor layer is skipped, the oxide semiconductor layer cannot be covered with a protective film sufficiently. Thus, moisture may be mixed into the oxide semiconductor layer, and variation in the characteristics may be caused.

In one embodiment of the disclosed invention, a transistor including an oxide semiconductor layer as a channel formation region and a circuit formed using the transistor are surrounded by a sealant including a closed pattern shape. A closed space is formed by a first substrate on which the transistor and the circuit are formed, the sealant, and a second substrate fixed to the first substrate with the sealant. By setting the closed space to be in a reduced pressure state or filling the closed space with dry air, a transistor which has stable electric characteristics and a circuit which has such a transistor can be obtained. Moreover, when a semiconductor device is manufactured using such a circuit, a highly reliable semiconductor device can be obtained.

One embodiment of the disclosed invention relates to a semiconductor device including a circuit including a transistor having an oxide semiconductor layer over a first substrate, and a second substrate fixed to the first substrate with a sealant. A closed space surrounded by the sealant, the first substrate, and the second substrate is set to be in a reduced pressure state or filled with dry air.

Another embodiment of the disclosed invention relates to a semiconductor device in which the sealant surrounds at least the transistor and has a closed pattern shape.

Another embodiment of the disclosed invention relates to a semiconductor device including a driver circuit and a pixel portion each including a transistor having an oxide semiconductor layer over a first substrate, and a second substrate fixed to the first substrate with a first sealant and a second sealant. The transistor in the driver circuit is surrounded by the first sealant, the transistor in the pixel portion is surrounded by the second sealant, a first closed space surrounded by the first sealant, the first substrate, and the second substrate is set to be in a reduced pressure state or filled with dry air, and a second closed space surrounded by the second sealant, the first substrate, and the second substrate is filled with a liquid crystal material.

Another embodiment of the disclosed invention relates to the semiconductor device in which the second substrate is a glass substrate.

Another embodiment of the disclosed invention relates to the semiconductor device in which the first substrate is a semiconductor substrate or a glass substrate.

Another embodiment of the disclosed invention relates to the semiconductor device in which the oxide semiconductor layer includes at least one of In, Ga, and Zn.

Another embodiment of the disclosed invention relates to the semiconductor device in which the first sealant and the second sealant have a closed pattern shape.

According to one embodiment of the disclosed invention, the number of photolithography steps used for manufacturing a transistor can be reduced to less than the conventional one and a highly reliable semiconductor device can be provided.

BRIEF DESCRIPTION OF THE DRAWINGS

In the accompanying drawings:

FIGS. 3A to 3D are cross-sectional views illustrating one embodiment of the present invention;

FIGS. 5A to 5C are cross-sectional views illustrating one embodiment of the present invention;

FIGS. 6A1, 6A2, 6B1, and 6B2 are top views and cross-sectional views illustrating one embodiment of the present invention;

DETAILED DESCRIPTION OF THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

Figure 1A:
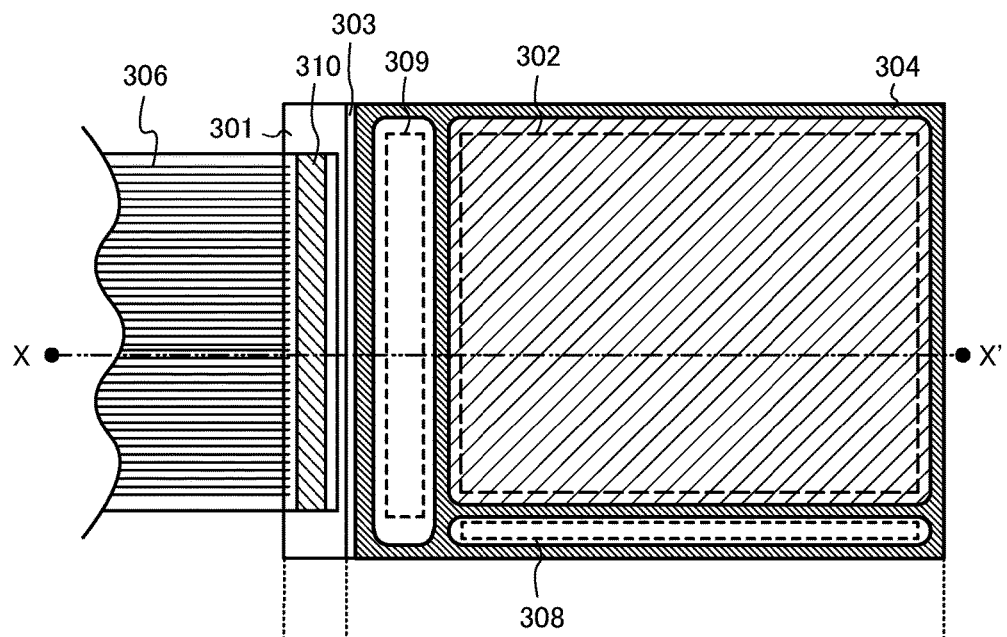
FIGS. 1A and 1B are a top view and a cross-sectional view illustrating one embodiment of the present invention.
Figure 1B:
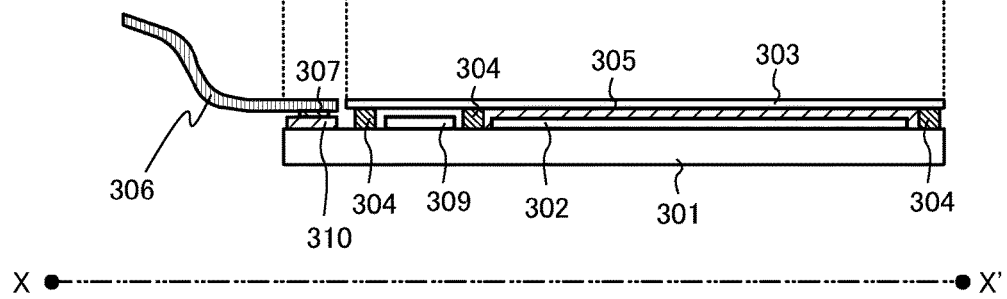

A top view and a cross-sectional view of the semiconductor device of this embodiment are illustrated in FIG. 1A and FIG. 1B respectively.

FIG. 1A is a plan view of a panel in which a pixel portion 302 and a liquid crystal layer 305 are sealed between a first substrate 301 and a second substrate 303 with a sealant 304. FIG. 1B corresponds to a cross-sectional view taken along line X-X' in FIG. 1A.

The semiconductor device illustrated in FIG. 1A and FIG. 1B includes the first substrate 301, the second substrate 303, the sealant 304 between the first substrate 301 and the second substrate 303, a terminal electrode 310, and an FPC (flexible printed circuit) 306. Moreover, the pixel portion 302, a driver circuit 308, and a driver circuit 309 are provided over the first substrate 301. Each of the driver circuits 308 and 309 is formed using an oxide semiconductor transistor. Further, a switching element in the pixel portion 302 may also be formed using an oxide semiconductor transistor. For example, the driver circuit 308 is a gate side driver circuit, and the driver circuit 309 is a source side driver circuit. Note that only n-channel transistors are used for the driver circuits 308 and 309, because the driver circuits 308 and 309 are formed using the oxide semiconductor transistors.

The sealant 304 surrounds each of the pixel portion 302, the driver circuit 308, and the driver circuit 309 provided over the first substrate 301, and has a closed pattern shape. Further, the second substrate 303 is fixed to the first substrate 301 by the sealant 304.

A closed space surrounded by the driver circuit 308, the first substrate 301, the second substrate 303, and the sealant 304 and a closed space surrounded by the driver circuit 309, the first substrate 301, the second substrate 303, and the sealant 304 are set to be in a reduced pressure state or filled with dry air.

By forming the sealant 304 which surrounds each of the driver circuit 308 and the driver circuit 309 and has a closed shape, and setting the closed space to be in a reduced pressure state or filling the plurality of closed spaces with dry air, moisture is prevented from being mixed into an oxide semiconductor layer of the oxide semiconductor transistor included in the driver circuit 308 and the driver circuit 309, and the oxide semiconductor transistor having stable electrical characteristics can be obtained. Note that, without limitation to an arrangement of a sealant in FIG. 1A, one closed space which is formed by surrounding both the driver circuit 308 and the driver circuit 309 with the sealant having a closed shape may be set to be in a reduced pressure state or filled with dry air. Further, a first closed space, which is formed by surrounding the driver circuit 308 with a first sealant having a closed shape, and a second closed space, which is formed by surrounding the driver circuit 309 with a second sealant having a closed shape, may be set to be in a reduced pressure state or filled with dry air. In this case, a third closed space, which is formed by surrounding the pixel portion 302 by a third sealant is filled with a liquid crystal material.

When a plurality of the oxide semiconductor transistors forming the driver circuit 308 and the driver circuit 309 has stable electrical characteristics, the total reliability of the semiconductor device including such driver circuits can be improved. Specifically, by preventing moisture from being mixed into the oxide semiconductor layer of the oxide semiconductor transistor in the driver circuits, degradation and a malfunction of the driver circuits can be suppressed and a display device with high reliability can be provided.

Note that an element other than the oxide transistor, for example, a diode, a capacitor, or the like may be provided in the driver circuit 308 and the driver circuit 309. In this case, it is important that at least the oxide semiconductor transistor or the whole driver circuit is surrounded by one or more sealants to prevent mixture of moisture.

In the closed space surrounded by the pixel portion 302, the first substrate 301, the second substrate 303, and the sealant 304, the liquid crystal layer 305 is sealed.

Moreover, the terminal electrode 310 is provided in a region outside the region surrounded by the sealant 304 over the first substrate 301. The terminal electrode 310 is connected to FPC 306 through an anisotropic conductive film 307. The FPC 306 serves to transmit a signal or an electric potential from outside.

Note that a connection method of a driver circuit separately formed over a different substrate is not particularly limited, and a chip on glass (COG) method, a wire bonding method, a tape carrier package (TCP) method, a tape automated bonding (TAB) method, or the like can be used.

Figure 7A:
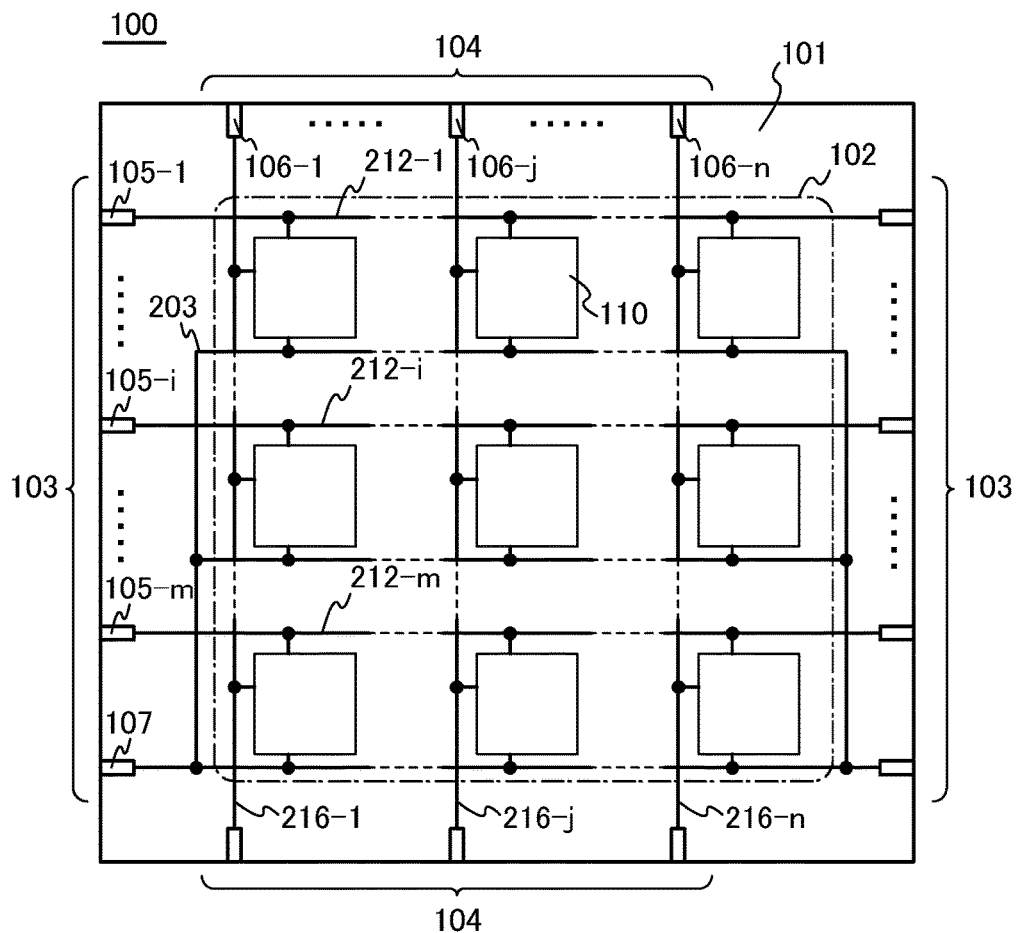
FIGS. 7A and 7B are circuit diagrams illustrating one embodiment of the present invention.

FIG. 7A illustrates an example of the configuration of a semiconductor device 100 that is used in a liquid crystal display device. The semiconductor device 100 includes a pixel region 102, a terminal portion 103 including m terminals 105 (m is an integer of greater than or equal to 1) and a terminal 107, and a terminal portion 104 including n terminals 106 (n is an integer of greater than or equal to 1) over a substrate 101. Further, the semiconductor device 100 includes m wirings 212 electrically connected to the terminal portion 103, n wirings 216 electrically connected to the terminal portion 104, and a wiring 203. The pixel region 102 includes a plurality of pixels 110 arranged in a matrix of m (rows) and n (columns). A pixel 110($i,j$) in the i-th row and the j-th column (i is an integer of greater than or equal to 1 and less than or equal to m, and j is an integer of greater than or equal to 1 and less than or equal to n) is electrically connected to a wiring 212-$i$ and a wiring 216-$j$. In addition, each pixel is connected to the wiring 203 serving as a capacitor electrode or a capacitor wiring, and the wiring 203 is electrically connected to the terminal 107. The wiring 212-$i$ is electrically connected to a terminal 105-$i$, and the wiring 216-$j$ is electrically connected to a terminal 106-$j$.

The terminal portion 103 and the terminal portion 104 are external input terminals and are connected to external control circuits with flexible printed circuits (FPC) or the like. Signals supplied from the external control circuits are input to the semiconductor device 100 through the terminal portion 103 and the terminal portion 104. In FIG. 7A, such terminal portions 103 are provided on the right and left of the pixel region 102, so that signals are input from two directions. Further, such terminal portions 104 are provided above and below the pixel region 102, so that signals are input from two directions. By inputting signals from two directions, signal supply capability is increased and high-speed operation of the semiconductor device 100 is facilitated. In addition, influences of signal delay due to an increase in size of the semiconductor device 100 or an increase in wiring resistance accompanied by an increase in definition can be reduced. Moreover, the semiconductor device 100 can have redundancy, so that reliability of the semiconductor device 100 can be improved. Although two terminal portions 103 and two terminal portions 104 are provided in FIG. 7A, a structure in which one terminal portion 103 and one terminal portion 104 are provided may also be employed.

Figure 7B:
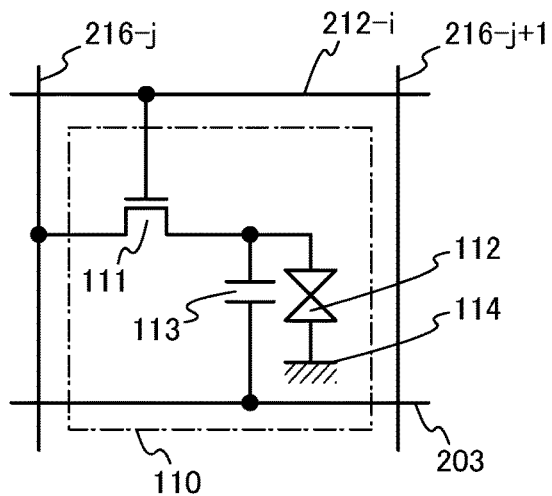

FIG. 7B illustrates a circuit configuration of the pixel 110. The pixel 110 includes a transistor 111, a liquid crystal element 112, and a capacitor 113. A gate electrode of the transistor 111 is electrically connected to the wiring 212-$i$, and one of a source electrode and a drain electrode of the transistor 111 is electrically connected to the wiring 216-$j$. The other of the source electrode and the drain electrode of the transistor 111 is electrically connected to one electrode of the liquid crystal element 112 and one electrode of the capacitor 113. The other electrode of the liquid crystal element 112 is electrically connected to an electrode 114. The potential of the electrode 114 may be a fixed potential such as 0 V, GND, or a common potential. The other electrode of the capacitor 113 is electrically connected to the wiring 203.

The transistor 111 has a function of selecting whether an image signal supplied from the wiring 216 is input to the liquid crystal element 112. After a signal that turns on the transistor 111 is supplied to the wiring 212-$i$, an image signal is supplied to the liquid crystal element 112 from the wiring 216-$j$ through the transistor 111. The transmittance of light is controlled in accordance with the image signal (potential) supplied to the liquid crystal element 112. The capacitor 113 has a function as a storage capacitor (also referred to as a Cs capacitor) for holding a potential supplied to the liquid crystal element 112. The capacitor 113 need not necessarily be provided; however, in the case of providing the capacitor 113, variation in the potential applied to the liquid crystal element 112, which is caused by a current flowing between a source electrode and a drain electrode in an off state of the transistor 111 (off-state current), can be suppressed.

An oxide semiconductor can be used for the material of the semiconductor layer where a channel region of the above transistor 111 is formed. An oxide semiconductor has an energy gap that is as wide as 3.0 eV to 3.5 eV, and thus has high transmittance with respect to visible light. In a transistor obtained by processing an oxide semiconductor under appropriate conditions, the off-state current at ambient temperature (e.g., 25° C.) can be less than or equal to 100 zA ($1 \times 10^{-19}$ A), less than or equal to 10 zA ($1 \times 10^{-20}$ A), and further less than or equal to 1 zA ($1 \times 10^{-21}$ A). Thus, the potential applied to the liquid crystal element 112 can be kept without the capacitor 113. In addition, in terms of realizing a liquid crystal display device with low power consumption, it is preferable to use an oxide semiconductor layer for the semiconductor layer in which the channel region of the transistor 111 is formed.

Further, as a channel region of the transistor 111, other than an oxide semiconductor layer, a single crystal semiconductor layer, a polycrystalline semiconductor layer, a microcrystalline semiconductor, an amorphous semiconductor layer, or the like may be used. Examples of a semiconductor material are silicon, germanium, silicon germanium, silicon carbide, gallium arsenide, and the like. The display device described in this embodiment has a structure in which the semiconductor layer remains in the pixel region; thus, in the case where the display device including the semiconductor is used as a transmissive display device, the transmittance of visible light is preferably increased by, for example, thinning the semiconductor layer as much as possible.

Figure 2:
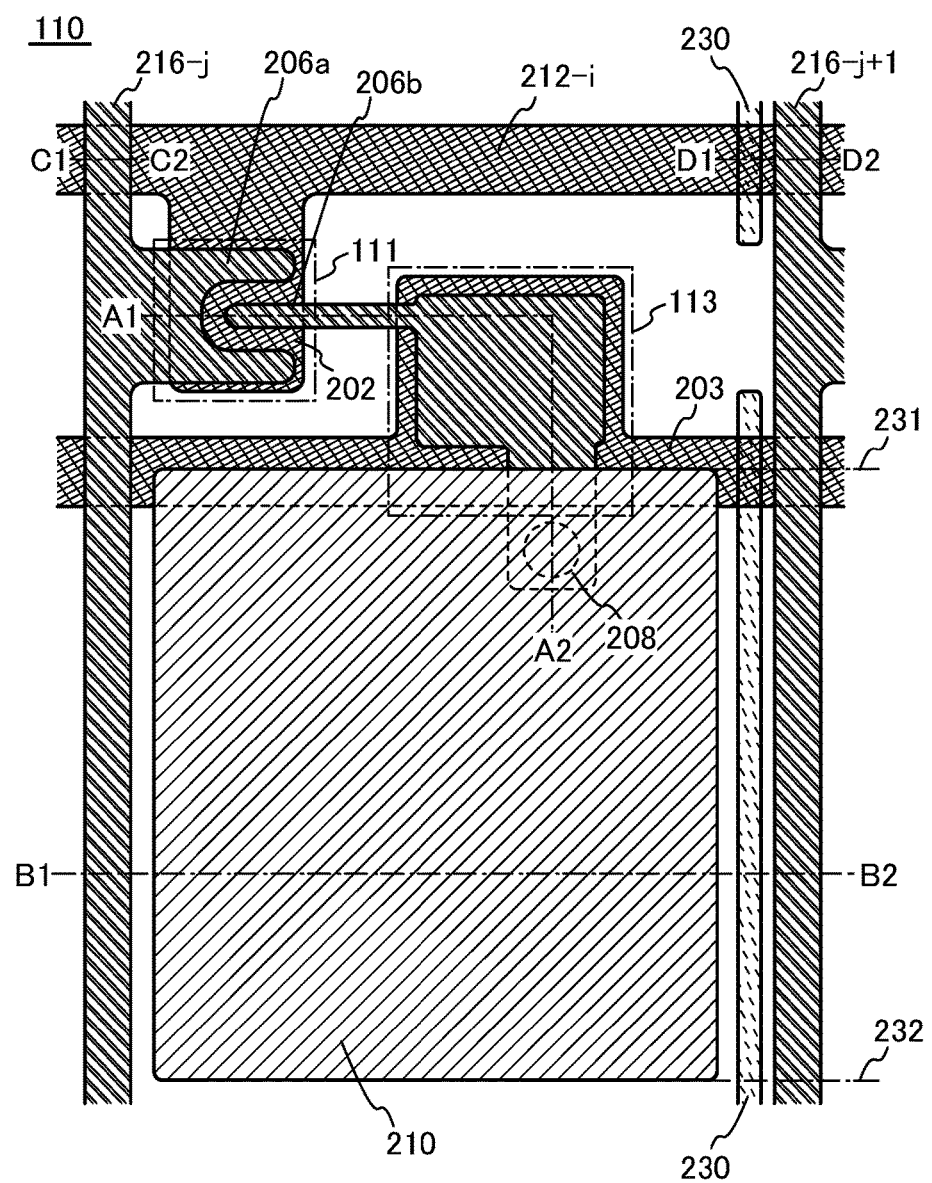
FIG. 2 is a top view illustrating one embodiment of the present invention.
Figure 4A:
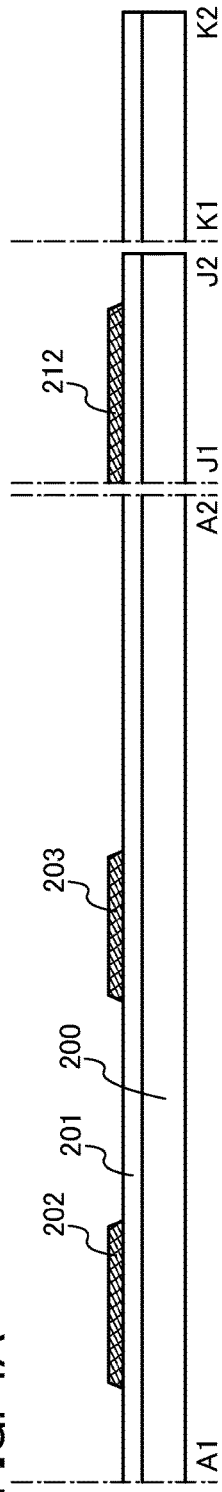
FIGS. 4A to 4C are cross-sectional views illustrating one embodiment of the present invention.
Figure 4B:
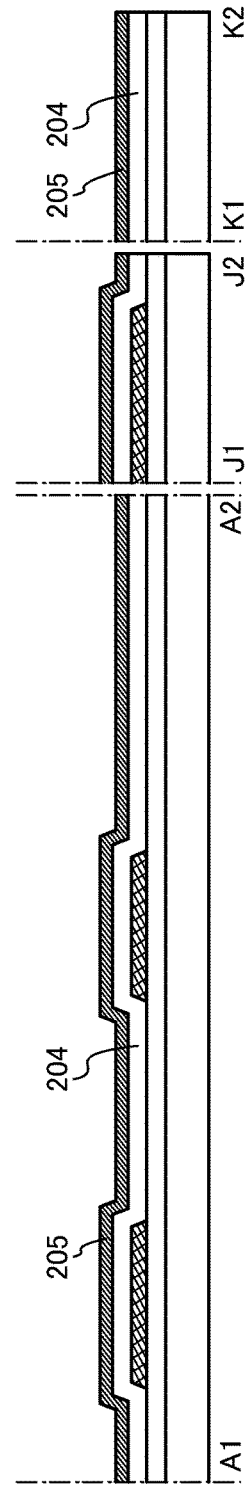
Figure 4C:
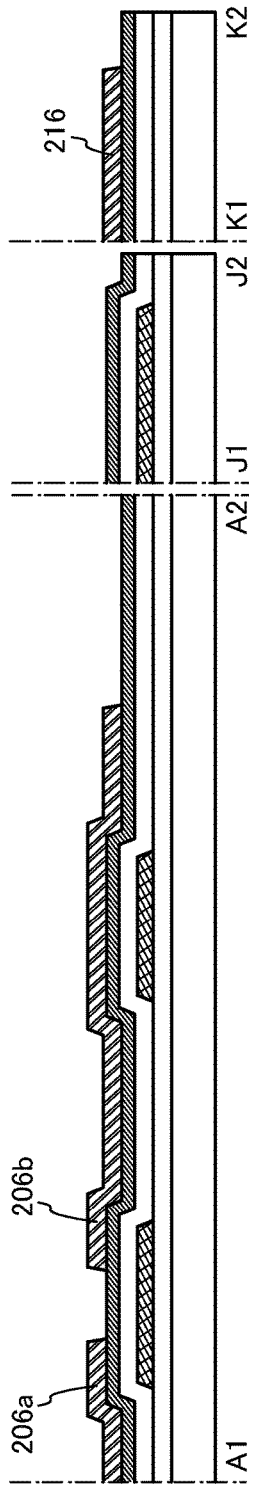

FIG. 2 is a top view illustrating a plan structure of the pixel 110 provided in the pixel portion 302, and FIGS. 3A to 3D are cross-sectional views illustrating a stacked structure of the pixel 110. Note that chain lines A1-A2, B1-B2, C1-C2, and D1-D2 in FIG. 2 correspond to cross sections A1-A2, B1-B2, C1-C2, and D1-D2 in FIGS. 3A to 3D, respectively.

In the transistor 111 in this embodiment, a drain electrode 206$b$ is surrounded by a source electrode 206$a$ that is U-shaped (or C-shaped, square-bracket-like shaped, or horseshoe-shaped). With such a shape, an enough channel width can be ensured even when the area of the transistor is small, and accordingly, the amount of current flowing at the time of conduction of the transistor (also referred to as the on-state current) can be increased.

If parasitic capacitance generated between a gate electrode 202 and the drain electrode 206$b$ electrically connected to a pixel electrode 210 is large, the transistor is easily influenced by feedthrough, which may cause degradation in display quality because the potential supplied to the liquid crystal element 112 cannot be held accurately. With the structure in which the source electrode 206$a$ is U-shaped and surrounds the drain electrode 206$b$ as described in this embodiment, an enough channel width can be ensured and parasitic capacitance generated between the drain electrode 206$b$ and the gate electrode 202 can be reduced. Therefore, the display quality of a liquid crystal display device can be improved.

The wiring 203 functions as a capacitor electrode or a capacitor wiring. In this embodiment, the capacitor 113 is formed using the overlapping wiring 203 and drain electrode 206$b$.

The semiconductor device described in this embodiment has a structure in which the semiconductor layer 205 remains in the entire pixel region because a photolithography step and an etching step for forming an island-shaped semiconductor layer are not performed in order to simplify the manufacturing process. Consequently, a first parasitic transistor in which the wiring 212-$i$ functions as a gate electrode, the wiring 216-$j$ functions as one of a source electrode and a drain electrode, and the wiring 216-$j$+1 functions as the other of the source electrode and the drain electrode is formed.

Further, a second parasitic transistor in which the wiring 203 functions as a gate electrode, the wiring 216-$j$ functions as one of a source electrode and a drain electrode, and the wiring 216-$j$+1 functions as the other of the source electrode and the drain electrode is formed.

Furthermore, a third parasitic transistor in which the pixel electrode 210 functions as a gate electrode, an insulating layer 207 functions as a gate insulating layer, the wiring 216-*j* functions as one of a source electrode and a drain electrode, and the wiring 216-*j*+1 functions as the other of the source electrode and the drain electrode is formed.

When such a potential as to turn on the transistor 111 is supplied to the wiring 212-*i*, the first parasitic transistor is also turned on, and the wiring 216-*j* and the wiring 216-*j*+1 are electrically connected to each other. The electrical connection between the wiring 216-*j* and the wiring 216-*j*+1 by the first parasitic transistor causes interference of image signals therebetween; accordingly, it becomes difficult to supply accurate image signals to the liquid crystal element 112.

In the case where the second parasitic transistor functions as an n-channel transistor, when the potential of the wiring 216-*j* or the wiring 216-*j*+1 is lower than that supplied to the wiring 203 and the absolute value of the potential difference is larger than the threshold of the second parasitic transistor, a channel is formed in the semiconductor layer 205 located below the pixel electrode 210 and the second parasitic transistor is on.

When the second parasitic transistor is on, the wiring 216-*j* and the wiring 216-*j*+1 are electrically connected to each other. The electrical connection between the wiring 216-*j* and the wiring 216-*j*+1 by the second parasitic transistor causes interference of image signals therebetween; accordingly, it becomes difficult to supply accurate image signals to the liquid crystal element 112.

In the case where the third parasitic transistor functions as an n-channel transistor, when the potential of the wiring 216-*j* or the wiring 216-*j*+1 is lower than the potential supplied to the pixel electrode 210 or the potential held at the pixel electrode 210 and the absolute value of the potential difference is larger than the threshold of the third parasitic transistor, a channel is formed in the semiconductor layer 205 located below the pixel electrode 210 and the third parasitic transistor is on.

When the third parasitic transistor is on, the wiring 216-*j* and the wiring 216-*j*+1 are electrically connected to each other. The electrical connection between the wiring 216-*j* and the wiring 216-*j*+1 by the third parasitic transistor causes interference of image signals therebetween; accordingly, it becomes difficult to supply accurate image signals to the liquid crystal element 112. When the pixel electrode 210 is formed close to the wiring 216-*j* or the wiring 216-*j*+1 for the purpose of increasing the pixel aperture ratio or the like, the influence of the third parasitic transistor is increased.

In view of this, a structure in which a groove portion 230 in which the semiconductor layer 205 is removed is provided in the pixel 110 so that the above-described parasitic transistors are not formed is employed in this embodiment. The groove portion 230 is provided so as to cross the wiring 212-*i* in the line width direction of the wiring 212-*i* across both edges thereof; in this way, formation of the first parasitic transistor can be prevented. In addition, the groove portion 230 is provided so as to cross the wiring 203 in the line width direction of the wiring 203 across both edges thereof; in this way, formation of the second parasitic transistor can be prevented. Note that a plurality of groove portions 230 may be provided over the wiring 212-*i*, and a plurality of groove portions 230 may be provided over the wiring 203.

Furthermore, the groove portion 230 is formed at least between the wiring 216-*j* and the pixel electrode 210 or between the wiring 216-*j*+1 and the pixel electrode 210, along a direction parallel to the direction in which the wiring 216-*j* or the wiring 216-*j*+1 extends, so as to extend beyond an edge 231 and an edge 232 of the pixel electrode 210. In this way, formation of the third parasitic transistor can be prevented. The groove portion 230 is not necessarily provided in parallel to the wiring 216-*j* or the wiring 216-*j*+1 and may have a flection portion or a bending portion.

In FIG. 2, the groove portions 230 are separated in a region between the wiring 212-*i* and the wiring 203. However, the groove portion 230 provided to cross the wiring 212-*i* in the line width direction of the wiring 212-*i* across the both edges thereof may be extended and connected to the groove portion 230 provided to cross the wiring 203 in the line width direction of the wiring 203 across the both edges thereof.

It is also possible to prevent formation of the second parasitic transistor without providing the groove portion 230 over the wiring 203 by setting the potential of the wiring 203 to be lower than the potential supplied to the wiring 216-*j* or the wiring 216-*j*+1. However in this case, a power supply for supplying the above-described potential to the wiring 203 needs to be provided additionally.

Although the size of the groove portion 230 in which the semiconductor layer 205 is removed is not particularly limited, for surely preventing formation of a parasitic transistor, the distance of the portion where the semiconductor layer is removed in the groove portion 230 in a direction perpendicular to the direction in which the wiring 216-*j* or the wiring 216-*j*+1 extends is preferably 1 μm or more, further preferably 2 μm or more.

The cross section A1-A2 shows the stacked structure of the transistor 111 and the stacked structure of the capacitor 113. The transistor 111 is a bottom-gate transistor. The cross section B1-B2 shows the stacked structure from the wiring 216-*j* to the wiring 216-*j*+1, including the pixel electrode 210 and the groove portion 230. Further, the cross section C1-C2 shows the stacked structure of an intersection of the wiring 216-*j* and the wiring 212-*i*. The cross section D1-D2 shows the stacked structure of an intersection of the wiring 216-*j*+1 and the wiring 212-*i* and the stacked structure of the groove portion 230.

In the cross section A1-A2 in FIG. 3A, a base layer 201 is formed over a substrate 200, and the gate electrode 202 and the wiring 203 are formed over the base layer 201. Over the gate electrode 202 and the wiring 203, a gate insulating layer 204 and a semiconductor layer 205 are formed. Over the semiconductor layer 205, the source electrode 206*a* and the drain electrode 206*b* are formed. Further, an insulating layer 207 is formed over the source electrode 206*a* and the drain electrode 206*b* so as to be in contact with part of the semiconductor layer 205. The pixel electrode 210 is formed over the insulating layer 207 and is electrically connected to the drain electrode 206*b* through a contact hole 208 formed in the insulating layer 207.

A portion in which the wiring 203 and the drain electrode 206*b* overlap with each other with the gate insulating layer 204 and the semiconductor layer 205 interposed therebetween functions as the capacitor 113. The gate insulating layer 204 and the semiconductor layer 205 function as a dielectric layer. In the case where a multi-layer dielectric layer is formed between the wiring 203 and the pixel electrode 210, even when a pinhole is generated in one dielectric layer, the pinhole is covered with another dielectric layer; accordingly, the capacitor 113 can operate normally. The relative permittivity of an oxide semiconductor is as high as 14 to 16. When the oxide semiconductor is used for the semiconductor layer 205, the capacitance value of the capacitor 113 can be increased.

In the cross section B1-B2 illustrated in FIG. 3B, the base layer 201 is formed over the substrate 200, the gate insulating layer 204 is formed over the base layer 201, and the semiconductor layer 205 is formed over the gate insulating layer 204. The wiring 216-$j$ and the wiring 216-$j$+1 are formed over the semiconductor layer 205, and the insulating layer 207 is formed over the semiconductor layer 205, the wiring 216-$j$, and the wiring 216-$j$+1. The pixel electrode 210 is formed over the insulating layer 207.

The groove portion 230 is formed between the wiring 216-$j$+1 and the pixel electrode 210 by removing part of the gate insulating layer 204, part of the semiconductor layer 205, and part of the insulating layer 207. The groove portion 230 does not include a semiconductor layer at least on its bottom surface.

In the cross section C1-C2 illustrated in FIG. 3C, the base layer 201 is formed over the substrate 200, and the wiring 212-$i$ is formed over the base layer 201. Over the wiring 212-$i$, the gate insulating layer 204 and the semiconductor layer 205 are formed. The wiring 216-$j$ is formed over the semiconductor layer 205, and the insulating layer 207 is formed over the wiring 216-$j$.

In the cross section D1-D2 illustrated in FIG. 3D, the base layer 201 is formed over the substrate 200, and the wiring 212-$i$ is formed over the base layer 201. Further, the gate insulating layer 204 and the semiconductor layer 205 are formed over the wiring 212-$i$. The wiring 216-$j$+1 is formed over the semiconductor layer 205, and the insulating layer 207 is formed over the wiring 216-$j$+1. In addition, the groove portion 230 is formed by removing part of the gate insulating layer 204, part of the semiconductor layer 205, and part of the insulating layer 207.

Next, examples of the structures of the terminal 105 and the terminal 106 will be described with reference to FIGS. 6A1, 6A2, 6B1, and 6B2. FIGS. 6A1 and 6A2 are a top view and a cross-sectional view, respectively, of the terminal 105. A chain line J1-J2 in FIG. 6A1 corresponds to a cross section J1-J2 in FIG. 6A2. FIGS. 6B1 and 6B2 are a top view and a cross-sectional view, respectively, of the terminal 106. A chain line K1-K2 in FIG. 6B1 corresponds to a cross section K1-K2 in FIG. 6B2. In the cross sections J1-J2 and K1-K2, J2 and K2 correspond to end portions of the substrate.

In the cross section J1-J2, the base layer 201 is formed over the substrate 200, and the wiring 212 is formed over the base layer 201. The gate insulating layer 204, the semiconductor layer 205, and the insulating layer 207 are formed over the wiring 212. An electrode 221 is formed over the insulating layer 207, and the electrode 221 is electrically connected to the wiring 212 through a contact hole 219 formed in the gate insulating layer 204, the semiconductor layer 205, and the insulating layer 207.

In the cross section K1-K2, the base layer 201, the gate insulating layer 204, and the semiconductor layer 205 are formed over the substrate 200. The wiring 216 is formed over the semiconductor layer 205, and the insulating layer 207 is formed over the wiring 216. An electrode 222 is formed over the insulating layer 207, and the electrode 222 is electrically connected to the wiring 216 through a contact hole 220 formed in the insulating layer 207.

Note that the terminal 107 can have a structure similar to that of the terminal 105 or the terminal 106.

The pixel region 102 and the terminal portion 104 are connected with n wirings 216. In the case where the wirings 216 extending from the pixel region 102 to the terminals 106 in the terminal portion 104 are located close to each other, a parasitic channel may be formed in a portion of the semiconductor layer 205, which is between the adjacent wirings 216, due to the potential difference between the adjacent wirings 216, and therefore the adjacent wirings 216 may be electrically connected to each other.

This phenomenon can be prevented by providing a conductive layer over the entire region from the pixel region 102 to the terminal portion 104 or between the adjacent wirings 216 with an insulating layer provided between the conductive layer and the semiconductor layer 205 and by setting the potential of the conductive layer to such a potential as not to form a parasitic channel in the semiconductor layer 205.

For example, since most of oxide semiconductors tend to be n-type semiconductors, in the case of using an oxide semiconductor for the semiconductor layer 205, the potential of the conductive layer is set to a potential that is lower than the potential supplied to the wirings 216.

Further, it is also possible to prevent electrical connection between the adjacent wirings 216 by removing the semiconductor layer 205 between the adjacent wirings 216 in a step for forming a contact hole that is to be described later.

Then, a manufacturing method of the pixel portion of the liquid crystal display device described with reference to FIG. 2, FIGS. 3A and 3B, FIGS. 6A1, 6A2, 6B1, and 6B2, and FIGS. 7A and 7B will be described with reference to FIGS. 4A to 4C and FIGS. 5A to 5C. Note that cross sections A1-A2, J1-J2, and K1-K2 in FIGS. 4A to 4C and FIGS. 5A to 5C are cross-sectional views of the portions taken along the chain lines A1-A2, J1-J2, and K1-K2 in FIG. 2, FIGS. 3A and 3B, and FIGS. 6A1, 6A2, 6B1, and 6B2, respectively.

Note that the structure and the manufacturing process of the transistor provided in the driver circuit 308 and the driver circuit 309 in FIGS. 1A and 1B are the same as those of the transistor 111 shown in FIG. 2, FIGS. 3A to 3D, FIGS. 4A to 4C, FIGS. 5A to 5C, and FIGS. 7A and 7B. Therefore, the description of the transistor 111 may be referred to for the structure and the manufacturing process of the transistor provided in the driver circuit 308 and the driver circuit 309.

First, an insulating layer to be the base layer 201 is formed with a thickness of greater than or equal to 50 nm and less than or equal to 300 nm, preferably greater than or equal to 100 nm and less than or equal to 200 nm over the substrate 200. As the substrate 200, as well as a glass substrate or a ceramic substrate, a plastic substrate or the like having heat resistance to withstand a process temperature in this manufacturing process can be used. In the case where a substrate does not need a light-transmitting property, a metal substrate such as a stainless alloy substrate or a semiconductor substrate whose surface is provided with an insulating layer, may be used. As the glass substrate, for example, an alkali-free glass substrate of barium borosilicate glass, aluminoborosilicate glass, aluminosilicate glass, or the like may be used. In addition, a quartz substrate, a sapphire substrate, or the like can be used. Further, as the substrate 200, a glass substrate with any of the following sizes can be used: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), and the 10th generation (2950 mm×3400 mm). In this embodiment, a substrate of aluminoborosilicate glass is used as the substrate 200.

The base layer 201 can be formed with a single-layer structure or a layered structure using one or more of the following insulating layers: an aluminum nitride layer, an aluminum oxynitride layer, a silicon nitride layer, a silicon oxide layer, a silicon nitride oxide layer, and a silicon oxynitride layer. The base layer 201 has a function of preventing diffusion of impurity elements from the substrate 200. Note that in this specification, silicon nitride oxide contains more nitrogen than oxygen and, preferably, in the case where measurements are performed using RBS and HFS, contains oxygen, nitrogen, silicon, and hydrogen at concentrations of greater than or equal to 5 at. % and less than or equal to 30 at. %, greater than or equal to 20 at. % and less than or equal to 55 at. %, greater than or equal to 25 at. % and less than or equal to 35 at. %, and greater than or equal to 10 at. % and less than or equal to 30 at. %, respectively. The base layer 201 can be formed by a sputtering method, a CVD method, a coating method, a printing method, or the like as appropriate.

In this embodiment, a stack of layers of silicon nitride and silicon oxide is used as the base layer 201. Specifically, a layer of silicon nitride is formed with a thickness of 50 nm over the substrate 200, and a layer of silicon oxide is formed with a thickness of 150 nm over the layer of silicon nitride. Note that the base layer 201 may be doped with phosphorus (P) or boron (B).

When a halogen element such as chlorine or fluorine is contained in the base layer 201, a function of preventing diffusion of impurity elements from the substrate 200 can be further improved. The peak of the concentration of a halogen element contained in the base layer 201 may be higher than or equal to $1 \times 10^{15}/cm^3$ and lower than or equal to $1 \times 10^{20}/cm^3$ when measured by secondary ion mass spectrometry (SIMS).

Alternatively, gallium oxide may be used for the base layer 201. Further alternatively, a layered structure including a layer of gallium oxide and the above insulating layer may be used for the base layer 201. Gallium oxide is a material which is hardly charged; therefore, variation in threshold voltage due to charge buildup of the insulating layer can be suppressed.

Next, over the base layer 201, a conductive layer is formed with a thickness of greater than or equal to 100 nm and less than or equal to 500 nm, preferably greater than or equal to 200 nm and less than or equal to 300 nm by a sputtering method, a vacuum evaporation method, or a plating method, a resist mask is formed by a first photolithography step, and the conductive layer is selectively removed by etching, whereby the gate electrode 202, the wiring 203, and the wiring 212 are formed.

The conductive layer for forming the gate electrode 202, the wiring 203, and the wiring 212 can be formed to have a single-layer structure or a layered structure using a metal material such as molybdenum (Mo), titanium (Ti), tungsten (W), tantalum (Ta), aluminum (Al), copper (Cu), chromium (Cr), neodymium (Nd), or scandium (Sc), or an alloy material containing any of these elements as its main component.

Since the conductive layer is formed into a wiring, it is preferable to use Al or Cu, which is a low-resistance material. When Al or Cu is used, signal delay is reduced, so that higher image quality can be realized. Al has low heat resistance; therefore, defects due to a hillock, a whisker, or migration tend to be caused. In order to prevent migration of Al, a layered structure including Al and a metal material having a higher melting point than Al such as Mo, Ti, or W is preferably used. In the case where a material containing Al is used for the conductive layer, the maximum process temperature in later steps is preferably lower than or equal to 380° C., further preferably lower than or equal to 350° C.

In addition, when Cu is used for the conductive layer, in order to prevent a defect due to migration and diffusion of Cu elements, a layered structure including Cu and a metal material having a higher melting point than Cu, such as Mo, Ti, or W, is preferably used. Further, in the case where a material containing Cu is used for the conductive layer, the maximum process temperature in later steps is preferably lower than or equal to 450° C.

In this embodiment, as the conductive layer, a Ti layer with a thickness of 5 nm is formed over the base layer 201 and a Cu layer with a thickness of 250 nm is formed over the Ti layer. Then, the conductive layer is selectively removed by etching through the first photolithography step, whereby the gate electrode 202, the wiring 203, and the wiring 212 are formed (see FIG. 4A). The formed gate electrode 202, wiring 203, and wiring 212 preferably have tapered edges because coverage with an insulating layer or a conductive layer that is later to be stacked thereover can be improved.

Note that the resist mask used in the photolithography step may be formed by an inkjet method. An inkjet method needs no photomask; thus, manufacturing cost can be further reduced. The resist mask is to be removed after the etching step, and the description about the removal of the resist mask in each photolithography step is omitted in this embodiment. In addition, unless otherwise specified, a photolithography step in this specification includes a step of forming a resist mask, a step of etching a conductive layer or an insulating layer, and a step of removing the resist mask.

Then, the gate insulating layer 204 is formed with a thickness of greater than or equal to 50 nm and less than or equal to 800 nm, preferably greater than or equal to 100 nm and less than or equal to 600 nm over the gate electrode 202, the wiring 203, and the wiring 212. The gate insulating layer 204 can be formed using silicon oxide, silicon nitride, silicon oxynitride, silicon nitride oxide, aluminum oxide, aluminum nitride, aluminum oxynitride, aluminum nitride oxide, tantalum oxide, gallium oxide, yttrium oxide, hafnium oxide, hafnium silicate ($HfSi_xO_y$ (x>0, y>0)), hafnium silicate to which nitrogen is added, hafnium aluminate to which nitrogen is added, or the like by a plasma CVD method, a sputtering method, or the like. The gate insulating layer 204 is not limited to a single layer, and a stack of different layers may be used. For example, the gate insulating layer 204 may be formed in the following manner: a silicon nitride ($SiN_y$ (y>0)) layer is formed by a plasma CVD method as a first gate insulating layer and a silicon oxide ($SiO_x$ (x>0)) layer is stacked over the first gate insulating layer as a second gate insulating layer.

Other than a sputtering method and a plasma CVD method, the gate insulating layer 204 can be formed by a film formation method such as a high-density plasma CVD method using microwaves (e.g., a frequency of 2.45 GHz).

In this embodiment, a stack of layers of silicon nitride and silicon oxide is used as the gate insulating layer 204. Specifically, a layer of silicon nitride is formed with a thickness of 50 nm over the base layer 201, the gate electrode 202, the wiring 203, and the wiring 212, and a layer of silicon oxide is formed with a thickness of 100 nm over the layer of silicon nitride.

In addition, the gate insulating layer 204 also serves as a protective layer. With a structure in which the gate electrode 202 containing Cu is covered with the insulating layer containing silicon nitride, diffusion of Cu from the gate electrode 202 can be prevented.

In the case where the semiconductor layer formed later is formed using an oxide semiconductor, the gate insulating layer 204 may be formed using an insulating material containing the same kind of component as the oxide semiconductor. In the case of stacking layers of different materials to form the gate insulating layer 204, a layer in contact with the oxide semiconductor may be formed using an insulating material containing the same kind of component as the oxide semiconductor. This is because such a material is compatible with the oxide semiconductor, and therefore, the use of such a material for the gate insulating layer 204 enables a state of the interface between the gate insulating layer 204 and the oxide semiconductor to be kept well. Here, "the same kind of component as the oxide semiconductor" means one or more elements selected from constituent elements of the oxide semiconductor. For example, in the case where the oxide semiconductor is formed using an In—Ga—Zn-based oxide semiconductor material, gallium oxide is given as an insulating material containing the same kind of component as the oxide semiconductor.

In the case of employing a layered structure for the gate insulating layer 204, the gate insulating layer 204 may have a layered structure of a film formed using an insulating material containing the same kind of component as the oxide semiconductor and a film formed using a material different from that of the film.

In order that the oxide semiconductor layer does not contain hydrogen, a hydroxyl group, and moisture as little as possible, it is preferable to preheat the substrate 200 in a preheating chamber of a sputtering apparatus as pretreatment before the formation of the oxide semiconductor layer so that impurities such as hydrogen or moisture adsorbed on the substrate 200 or the gate insulating layer 204 are eliminated and removed. As an evacuation unit provided in the preheating chamber, a cryopump is preferable. Note that this preheating treatment can be omitted. Further, this preheating may be similarly performed on the substrate 200 over which the gate electrode 202, the wiring 203, and the wiring 212 are formed before the formation of the gate insulating layer 204.

As an oxide semiconductor layer used for the semiconductor layer 205, the following metal oxide can be used: a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn-Al—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based material; a single-component metal oxide such as an In—O-based oxide semiconductor, a Sn—O-based oxide semiconductor, or a Zn—O-based oxide semiconductor; or the like. Further, $SiO_2$ may be contained in the above oxide semiconductor.

The oxide semiconductor layer preferably includes In, more preferably includes In and Ga. In order to obtain an i-type (intrinsic) oxide semiconductor layer, dehydration treatment or dehydrogenation treatment to be performed later is effective.

Note that here, for example, an In—Ga—Zn—O-based oxide semiconductor means an oxide semiconductor containing indium (In), gallium (Ga), and zinc (Zn), and there is no limitation on the stoichiometric proportion. The In—Ga—Zn—O-based oxide semiconductor may contain an element other than In, Ga, and Zn.

For the oxide semiconductor layer, a thin film expressed by a chemical formula of $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like.

In this embodiment, the oxide semiconductor layer with a thickness of 30 nm is formed by a sputtering method with the use of an In—Ga—Zn—O-based oxide target. The oxide semiconductor layer can be formed by a sputtering method in a rare gas (typically, argon) atmosphere, an oxygen atmosphere, or a mixed atmosphere of a rare gas and oxygen (see FIG. 4B).

As a target used for forming the oxide semiconductor layer by a sputtering method, for example, a metal oxide target having the following composition ratio is used: $In_2O_3$:$Ga_2O_3$:ZnO is 1:1:1 [molar ratio]; thus, an In—Ga—Zn—O layer is formed. Without limitation to the material and the composition of this target, for example, a metal oxide target containing $In_2O_3$, $Ga_2O_3$, and ZnO at 1:1:2 [molar ratio] may be used.

The filling rate of the metal oxide target is higher than or equal to 90% and lower than or equal to 100%, preferably higher than or equal to 95% and lower than or equal to 99.9%. With the use of a metal oxide target with a high filling rate, the formed oxide semiconductor layer can be dense.

It is preferable that a high-purity gas from which impurities such as hydrogen, water, a hydroxyl group, or hydride are removed be used as a sputtering gas for the formation of the oxide semiconductor layer.

When the oxide semiconductor layer is formed, the substrate is held in a film formation chamber kept under a reduced pressure, and the substrate temperature is set to a temperature of higher than or equal to 100° C. and lower than or equal to 600° C., preferably higher than or equal to 300° C. and lower than or equal to 500° C. Note that in the case where Al is used for the wiring layer formed through the first photolithography step, the substrate temperature is set to lower than or equal to 380° C., preferably lower than or equal to 350° C. Alternatively, in the case where Cu is used for the wiring layer formed through the first photolithography step, the substrate temperature is set to lower than or equal to 450° C.

By heating the substrate during the film formation, the concentration of impurities such as hydrogen, moisture, hydride, or hydroxide in the oxide semiconductor layer can be reduced. In addition, damage by sputtering can be reduced. Then, a sputtering gas from which hydrogen and moisture are removed is introduced into the film formation chamber and moisture remaining therein is removed, and the oxide semiconductor layer is formed with the use of the above target.

In order to remove moisture remaining in the film formation chamber, an entrapment vacuum pump such as a cryopump, an ion pump, or a titanium sublimation pump is preferably used. As an evacuation unit, a turbo molecular pump provided with a cold trap may be used. In the film formation chamber which is evacuated with the cryopump, a hydrogen atom, a compound containing a hydrogen atom such as water ($H_2O$) (more preferably, also a compound containing a carbon atom), and the like are removed, whereby the impurity concentration in the oxide semiconductor layer formed in the film formation chamber can be reduced.

An example of the film formation conditions is as follows: the distance between the substrate and the target is 100 mm, the pressure is 0.6 Pa, the DC power source is 0.5 kW, and in an oxygen (the flow rate of oxygen is 100%) atmosphere. Note that a pulsed direct-current power source is preferably used, in which case powder substances (also referred to as particles or dust) that are generated in film formation can be reduced and the film thickness can be uniform.

The concentrations of alkali metals such as sodium (Na), lithium (Li), and potassium (K) in the oxide semiconductor layer are as follows. The concentration of Na is lower than or equal to $5\times10^{16}$ cm$^{-3}$, preferably lower than or equal to $1\times10^{16}$ cm$^{-3}$, further preferably lower than or equal to $1\times10^{15}$ cm$^{-3}$. The concentration of Li is lower than or equal to $5\times10^{15}$ cm$^{-3}$, preferably lower than or equal to $1\times10^{15}$ cm$^{-3}$. The concentration of K is lower than or equal to $5\times10^{15}$ cm$^{-3}$, preferably lower than or equal to $1\times10^{15}$ cm$^{-3}$.

It has been pointed out that an oxide semiconductor is insensitive to impurities, there is no problem when a considerable amount of metal impurities is contained in the oxide semiconductor, and therefore, soda-lime glass which contains a large amount of alkali metal such as sodium and is inexpensive can also be used (Kamiya, Nomura, and Hosono, "Carrier Transport Properties and Electronic Structures of Amorphous Oxide Semiconductors: The present status", *KOTAI BUTSURI* (*SOLID STATE PHYSICS*), 2009, Vol. 44, pp. 621-633). However, this is not a proper consideration. Alkali metal is not an element for forming in an oxide semiconductor, and therefore, is an impurity. Also, alkaline-earth metal is an impurity in the case where alkaline-earth metal is not an element for forming an oxide semiconductor. Alkali metal, in particular, Na becomes Na$^+$ when an insulating layer in contact with the oxide semiconductor layer is an oxide and Na diffuses into the insulating layer. Further, in the oxide semiconductor layer, Na cuts or enters a bond between metal and oxygen, which are included in the oxide semiconductor. As a result, for example, deterioration of characteristics of the transistor, such as a normally-on state of the transistor due to shift of a threshold voltage in the negative direction, or reduction in mobility, occurs. In addition, variation in characteristics also occurs. Such deterioration of characteristics of the transistor and variation in characteristics due to the impurity remarkably appear when the hydrogen concentration in the oxide semiconductor layer is very low. Therefore, the concentrations of alkali metals in the oxide semiconductor is strongly required to set in the aforementioned ranges in the case where the hydrogen concentration in the oxide semiconductor is lower than or equal to $5\times10^{19}$ cm$^{-3}$, particularly lower than or equal to $5\times10^{18}$ cm$^{-3}$.

Next, first heat treatment is performed. By the first heat treatment, excess hydrogen (including water and a hydroxyl group) in the oxide semiconductor layer is removed (dehydration or dehydrogenation), and then the structure of the oxide semiconductor layer is ordered by supply of oxygen, whereby defect levels in the energy gap can be reduced. In addition, defects generated at the interface between the oxide semiconductor layer and the insulating layer in contact with the oxide semiconductor layer can be reduced.

The first heat treatment is preferably performed at a temperature of higher than or equal to 250° C. and lower than or equal to 750° C., or higher than or equal to 400° C. and lower than the strain point of the substrate in a reduced pressure atmosphere, an inert gas atmosphere such as a nitrogen atmosphere or a rare gas atmosphere, an oxygen gas atmosphere, or an ultra dry air atmosphere (in air whose moisture content is lower than or equal to 20 ppm (the dew point: −55° C.), preferably lower than or equal to 1 ppm, further preferably lower than or equal to 10 ppb in the case where measurement is performed using a dew-point meter of a cavity ring-down laser spectroscopy (CRDS) system). Note that in the case where Al is used for the wiring layer formed through the first photolithography step, the heat treatment temperature is set to lower than or equal to 380° C., preferably lower than or equal to 350° C. Alternatively, in the case where Cu is used for the wiring layer formed through the first photolithography step, the heat treatment temperature is set to lower than or equal to 450° C. In this embodiment, the substrate is introduced into an electric furnace, which is a kind of heat treatment apparatuses, and heat treatment is performed on the oxide semiconductor layer at 450° C. in a nitrogen atmosphere for one hour.

Note that the heat treatment apparatus is not limited to the electrical furnace, and may include a device for heating a process object by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating a process object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the high-temperature gas, an inert gas which does not react with a process object by heat treatment, such as nitrogen or a rare gas such as argon, is used.

For example, as the first heat treatment, GRTA may be performed as follows. The substrate is transferred and put in an inert gas heated to a high temperature, is heated for several minutes, and is transferred and taken out of the inert gas heated to the high temperature.

When the heat treatment is performed in an atmosphere of an inert gas such as nitrogen or a rare gas, oxygen, or ultra-dry air, it is preferable that the atmosphere do not contain water, hydrogen, or the like. It is also preferable that the purity of nitrogen, oxygen, or the rare gas which is introduced into a heat treatment apparatus be set to be 6N (99.9999%) or higher, preferably 7N (99.99999%) or higher (that is, the impurity concentration is 1 ppm or lower, preferably 0.1 ppm or lower).

The carrier concentration of the oxide semiconductor, in which hydrogen is reduced to a sufficiently low concentration so that the oxide semiconductor is purified and in which defect states in an energy gap due to oxygen deficiency are reduced by sufficiently supplying oxygen, is lower than $1\times10^{12}$ /cm$^3$, preferably lower than $1\times10^{11}$/cm$^3$, further preferably lower than $1.45\times10^{10}$/cm$^3$. For example, the off-state current (per unit channel width (1 μm) here) at room temperature (25° C.) is 100 zA/μm (1 zA (zeptoampere) is $1\times10^{-21}$A) or less, preferably 10 zA/μm or less. The off-state current at 85° C. is 100 zA/μm ($1\times10^{-19}$ A/μm) or less, preferably 10 zA/μm ($1\times10^{-20}$ A/μm) or less. The transistor 111 with very excellent off-state current characteristics can be obtained with the use of such an i-type (intrinsic) or substantially i-type oxide semiconductor.

The electrical characteristics of a transistor including a purified oxide semiconductor, such as the threshold voltage and the on-state current, have almost no temperature dependence. Further, transistor characteristics hardly change due to light deterioration.

As described above, variation in electric characteristics of a transistor including a purified and electrically i-type (intrinsic) oxide semiconductor obtained by sufficient supply of oxygen is suppressed and thus, the transistor is electrically stable. Accordingly, a liquid crystal display device including an oxide semiconductor, which has high reliability and stable electric characteristics, can be provided.

Next, a conductive layer to be processed into the source electrode 206a, the drain electrode 206b, and the wiring 216 is formed over the semiconductor layer 205. The conductive layer for forming the source electrode 206a, the drain electrode 206b, and the wiring 216 can be formed using a material and a method similar to those of the gate electrode 202. The conductive layer for forming the source electrode 206a, the drain electrode 206b, and the wiring 216 may be formed using a conductive metal oxide. As the conductive metal oxide, indium oxide ($In_2O_3$), tin oxide ($SnO_2$), zinc oxide (ZnO), indium oxide-tin oxide alloy ($In_2O_3$—$SnO_2$; abbreviated to ITO), indium oxide-zinc oxide alloy ($In_2O_3$—ZnO), or any of these metal oxide materials in which silicon or silicon oxide is contained can be used.

In this embodiment, the conductive layer is formed as follows: a Ti layer with a thickness of 5 nm is formed over the semiconductor layer 205, and a Cu layer with a thickness of 250 nm is formed over the Ti layer. Then, a resist mask is formed by a second photolithography step and the conductive layer is selectively etched; thus, the source electrode 206a, the drain electrode 206b, and the wiring 216 are formed (see FIG. 4C).

Next, the insulating layer 207 is formed over the source electrode 206a, the drain electrode 206b, and the wiring 216 (see FIG. 5A). The insulating layer 207 can be formed using a material and a method similar to those of the gate insulating layer 204 or the base layer 201. Sputtering is preferably employed in terms of low possibility of entry of hydrogen, water, and the like. If hydrogen is contained in the insulating layer 207, hydrogen might enter the oxide semiconductor layer or extract oxygen in the oxide semiconductor layer, which might cause a reduction in resistance of the oxide semiconductor layer (which means that the oxide semiconductor layer becomes n-type). Therefore, it is important to use a method by which hydrogen and an impurity containing hydrogen are not mixed in the insulating layer 207, for forming the insulating layer 207.

As the insulating layer 207, an inorganic insulating material such as silicon oxide, silicon oxynitride, hafnium oxide, aluminum oxide, or gallium oxide can be typically used. Gallium oxide is a material which is hardly charged; therefore, variation in threshold voltage due to charge buildup of the insulating layer can be suppressed. Note that in the case where an oxide semiconductor is used for the semiconductor layer 205, a metal oxide layer containing the same kind of component as the oxide semiconductor may be formed as the insulating layer 207 or stacked over the insulating layer 207.

In this embodiment, a 200-nm-thick silicon oxide layer is formed as the insulating layer 207 by a sputtering method. The substrate temperature in film formation may be higher than or equal to room temperature and lower than or equal to 300° C. and in this embodiment, is 100° C. The silicon oxide layer can be formed by sputtering in a rare gas (typically argon) atmosphere, an oxygen atmosphere, or a mixed atmosphere of a rare gas and oxygen. As a target, a silicon oxide target or a silicon target can be used. For example, a silicon oxide layer can be formed by sputtering in an atmosphere containing oxygen with the use of silicon for the target.

In order to remove remaining moisture from the deposition chamber at the time of formation of the insulating layer 207, an entrapment vacuum pump (e.g., a cryopump) is preferably used. When the insulating layer 207 is formed in the deposition chamber evacuated using a cryopump, the impurity concentration in the insulating layer 207 can be reduced. In addition, as an exhaustion unit for removing moisture remaining in the chamber used for depositing the insulating layer 207, a turbo molecular pump provided with a cold trap may be used.

It is preferable that a high-purity gas from which impurities such as hydrogen, water, a hydroxyl group, or a hydride have been removed be used as a sputtering gas for the formation of the insulating layer 207.

Then, second heat treatment may be performed in a reduced pressure atmosphere, an inert gas atmosphere, an oxygen gas atmosphere, or an ultra-dry air atmosphere (preferably at higher than or equal to 200° C. and lower than or equal to 600° C., for example, higher than or equal to 250° C. and lower than or equal to 550° C.). Note that in the case where Al is used for a wiring layer formed by the first photolithography step or the second photolithography step, the heat treatment temperature is set to be 380° C. or lower, preferably 350° C. or lower. In the case where Cu is used for a wiring layer formed by the first photolithography step or the second photolithography step, the heat treatment temperature is set to be 450° C. or lower. For example, the second heat treatment may be performed at 450° C. for one hour in a nitrogen atmosphere. By the second heat treatment, part of the oxide semiconductor layer (a channel formation region) is heated in the state of being in contact with the insulating layer 207, so that oxygen can be supplied from the insulating layer 207 containing oxygen to the semiconductor layer 205. It is preferable that the above atmosphere do not contain water, hydrogen, or the like.

Next, a resist mask is formed by a third photolithography step, and part of the insulating layer 207 over the drain electrode 206b is selectively removed, so that the contact hole 208 is formed. In addition, part of the insulating layer 207 over the wiring 216 in the cross section K1-K2 is selectively removed, so that the contact hole 220 is formed. Over the wiring 212 in the cross section J1-J2, part of the insulating layer 207, part of the semiconductor layer 205, and part of the gate insulating layer 204 are selectively removed, so that the contact hole 219 is formed (see FIG. 5B). Although not illustrated, by this photolithography step, the groove portions 230 are formed in a manner similar to that of the contact hole 219. Therefore, at the side surface of the groove portions 230, the insulating layer 207, the semiconductor layer 205, and the gate insulating layer 204 are exposed.

For the etching of the insulating layer 207, the semiconductor layer 205, and the gate insulating layer 204, either dry etching or wet etching or both of them may be used. For example, a gas containing chlorine (a chlorine-based gas such as chlorine ($Cl_2$), boron trichloride ($BCl_3$), silicon tetrachloride ($SiCl_4$), or carbon tetrachloride ($CCl_4$)) can be employed as an etching gas used for the dry etching.

As the dry etching, a parallel-plate reactive ion etching (RIE) method, an inductively coupled plasma (ICP) etching method, or the like can be used. Since the base layer 201 has a function of preventing diffusion of an impurity element from the substrate 200, for the above etching, etching conditions are preferably adjusted so as to etch the base layer 201 as little as possible.

In general, etching of the semiconductor layer and formation of the contact hole are separately performed through their respective photolithography steps and etching steps; according to the manufacturing process of this embodiment, etching of the semiconductor layer and formation of the contact hole can be performed by one photolithography step and one etching step. Therefore, not only the number of photomasks but the number of photolithography steps can be reduced, which can reduce the number of etching steps after the photolithography steps. That is, a liquid crystal display device can be manufactured with a small number of photolithography steps, at low cost with high productivity.

In addition, according to the manufacturing process of this embodiment, a photoresist is not directly formed on the oxide semiconductor layer. Further, since the channel formation region in the oxide semiconductor layer is protected by the insulating layer 207, moisture is not attached to the channel formation region in the oxide semiconductor layer in later separation and cleaning steps of the photoresist; thus, variation in characteristics of the transistor 111 is reduced and the reliability is increased.

Next, a light-transmitting conductive layer (also referred to as a transparent conductive layer) that is to be processed into the pixel electrode 210, the electrode 221, and the electrode 222 is formed with a thickness of more than or equal to 30 nm and less than or equal to 200 nm, preferably more than or equal to 50 nm and less than or equal to 100 nm, over the insulating layer 207 by a sputtering method, a vacuum evaporation method, or the like (see FIG. 5C).

For the light-transmitting conductive layer, a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added can be used. Alternatively, a material formed of one to ten graphene sheets (corresponding to one layer of graphite) may be used.

In this embodiment, an example of a manufacturing method of a pixel portion of a transmissive liquid crystal display device has been described. However, without limitation thereto, an embodiment of present invention can be applied to a pixel portion of a reflective or semi-transmissive liquid crystal display device as well. In the case of obtaining a pixel portion of a reflective liquid crystal display device, the pixel electrode may be formed using a conductive layer with high light reflectance (also referred to as a reflective conductive layer), for example, using a metal having high visible-light reflectance, such as aluminum, titanium, silver, rhodium, or nickel; an alloy containing at least one of the above metals; or stacked layers of the above materials. In the case of obtaining a pixel portion of a semi-transmissive liquid crystal display device, one pixel electrode is formed using a transparent conductive layer and a reflective conductive layer and provided with a transmissive portion and a reflective portion.

In this embodiment, an ITO layer with a thickness of 80 nm is formed as the light-transmitting conductive layer. By a fourth photolithography step, a resist mask is formed, and the light-transmitting conductive layer is selectively etched; thus, the pixel electrode 210, the electrode 221, and the electrode 222 are formed.

The pixel electrode 210 is electrically connected to the drain electrode 206b through the contact hole 208. The electrode 221 is electrically connected to the wiring 212 through the contact hole 219. Further, the electrode 222 is electrically connected to the wiring 216 through the contact hole 220.

In addition, in the contact hole 219 and the contact hole 220 formed in the terminal portion 103 and the terminal portion 104, it is important that the wiring 212 and the wiring 216 be not kept in an exposed state and be covered with an oxide conductive material such as ITO. When the wiring 212 and the wiring 216 which are metal layers are kept in an exposed state, exposed surfaces are oxidized and contact resistance with an FPC or the like is increased. The increase in contact resistance causes distortion in waveform or delay of a signal that is input from the outside, and a signal from the outside cannot be transmitted correctly, so that the reliability of the semiconductor device is lowered. By covering the exposed surfaces of the wiring 212 and the wiring 216 with an oxide conductive material such as ITO, the increase in contact resistance can be prevented, and the reliability of the semiconductor device can be improved.

According to this embodiment, a semiconductor device can be manufactured through a smaller number of photolithography steps than the conventional one. Therefore, a semiconductor device can be manufactured at low cost with high productivity.

Further, in this embodiment, by surrounding the driver circuit with the sealant, moisture can be prevented from entering the oxide semiconductor layer of the oxide semiconductor transistor provided in the driver circuit. Accordingly, a highly reliable semiconductor device can be manufactured.

Note that, in this embodiment, an example of a bottom-gate transistor is described, but this embodiment can also be applied to a top gate transistor.

EXAMPLE

In FIGS. 8A and 8B and FIGS. 9A and 9B, characteristics of a transistor as a comparative example and an oxide semiconductor transistor manufactured according to the description of the embodiment are shown.

In this example, a gate-bias stress test was performed on the transistor as the comparative example and the oxide semiconductor transistor manufactured based on the description of the embodiment, and these transistors were compared with each other. Note that the transistor as the comparative example refers to a transistor which is not surrounded by a sealant. Moisture can be mixed into such a transistor as a comparative example.

Figure 8A:
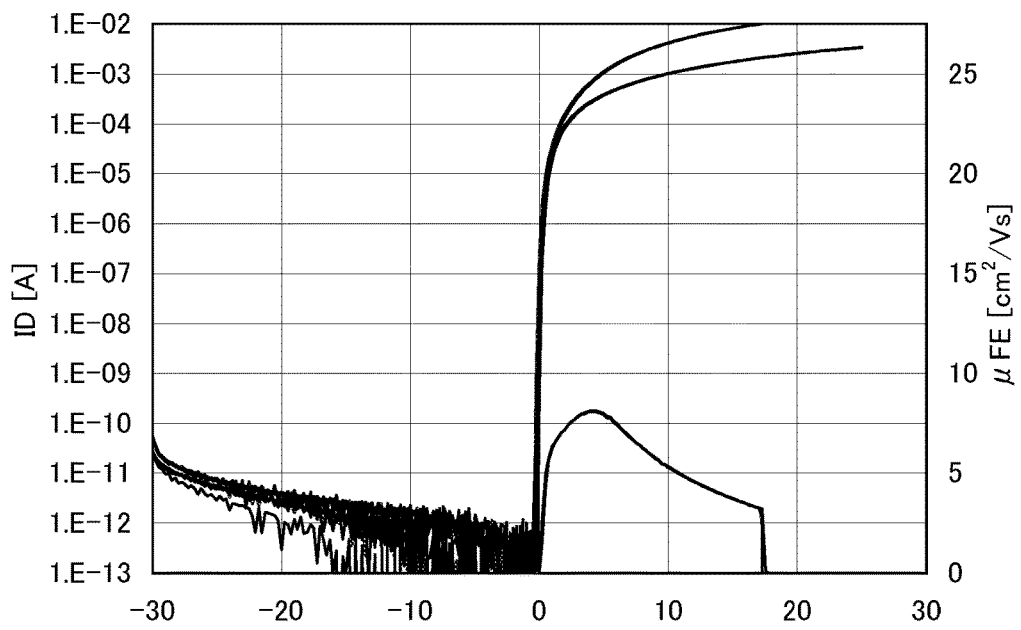
FIGS. 8A and 8B are diagrams illustrating one embodiment of the present invention.
Figure 8B:
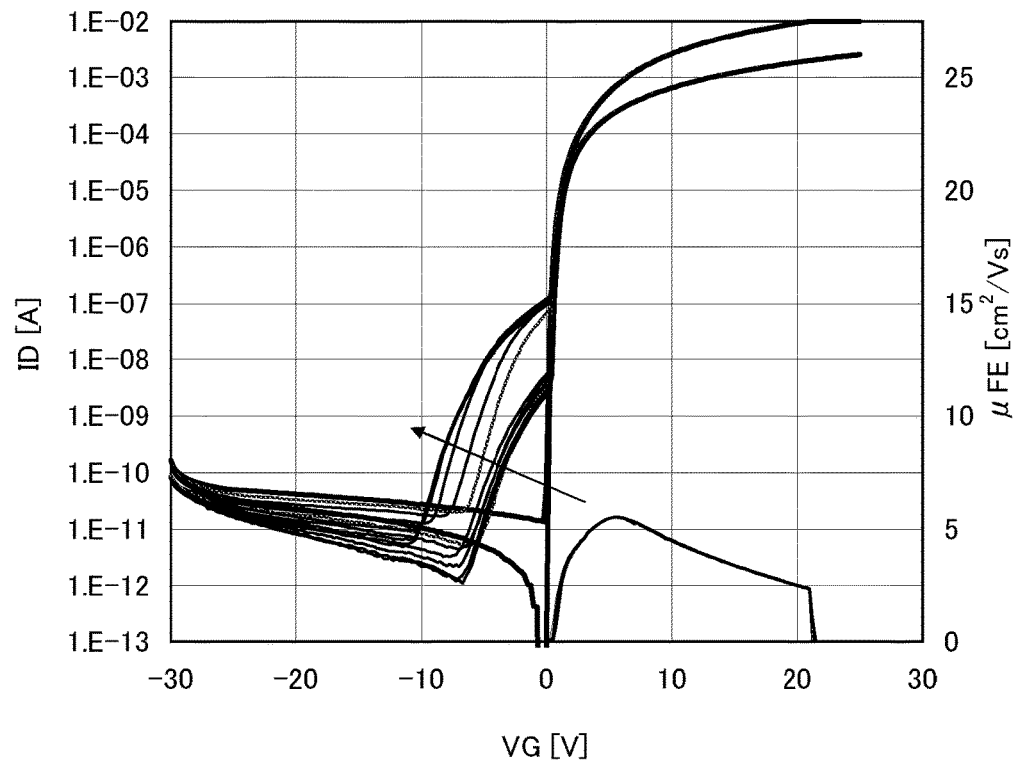

FIG. 8A shows a relation between the gate voltage (Vg) and the drain current (Id) (Vg-Id curve) after the test of the oxide semiconductor transistor manufactured based on the description of the embodiment. FIG. 8B shows Vg-Id curve of the transistor as the comparative example. In FIGS. 8A and 8B, the test was performed on the transistors at a temperature of 25° C. with a gate voltage of +30 V applied for a maximum of 2000 seconds.

A comparison between FIG. 8A and FIG. 8B shows that rising of a drain current (Id) at the gate voltage (Vg) of 0 V changes in the transistor as the comparative example. On the other hand, in the oxide semiconductor transistor manufactured based on the description of the embodiment, rising of a drain current (Id) at the gate voltage (Vg) of 0V is substantially uniform.

Figure 9A:
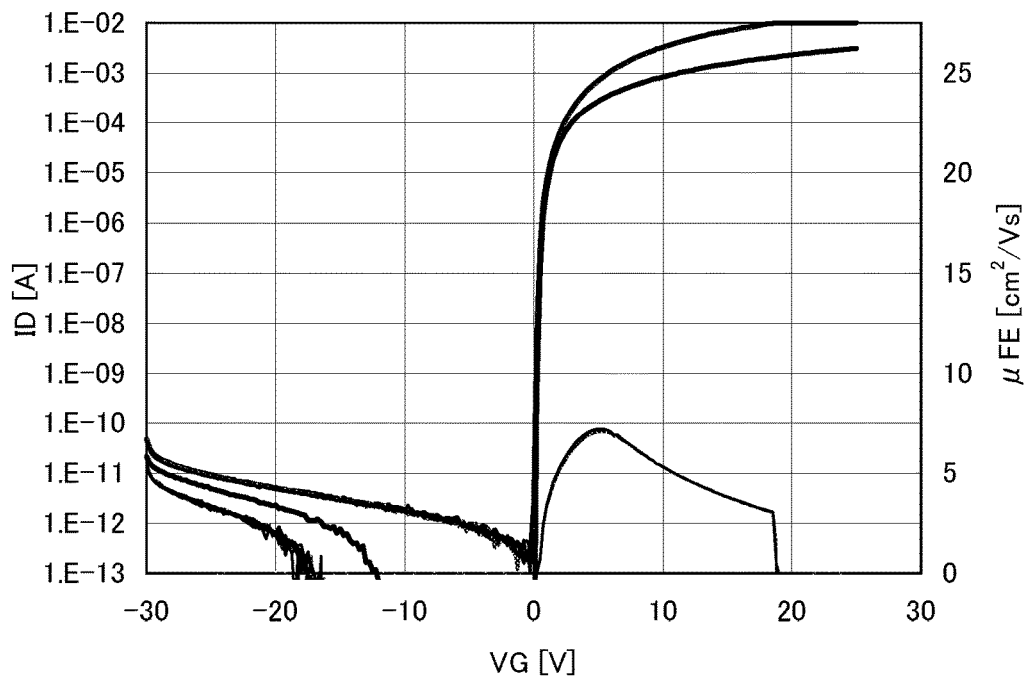
FIGS. 9A and 9B are diagrams illustrating one embodiment of the present invention.
Figure 9B:
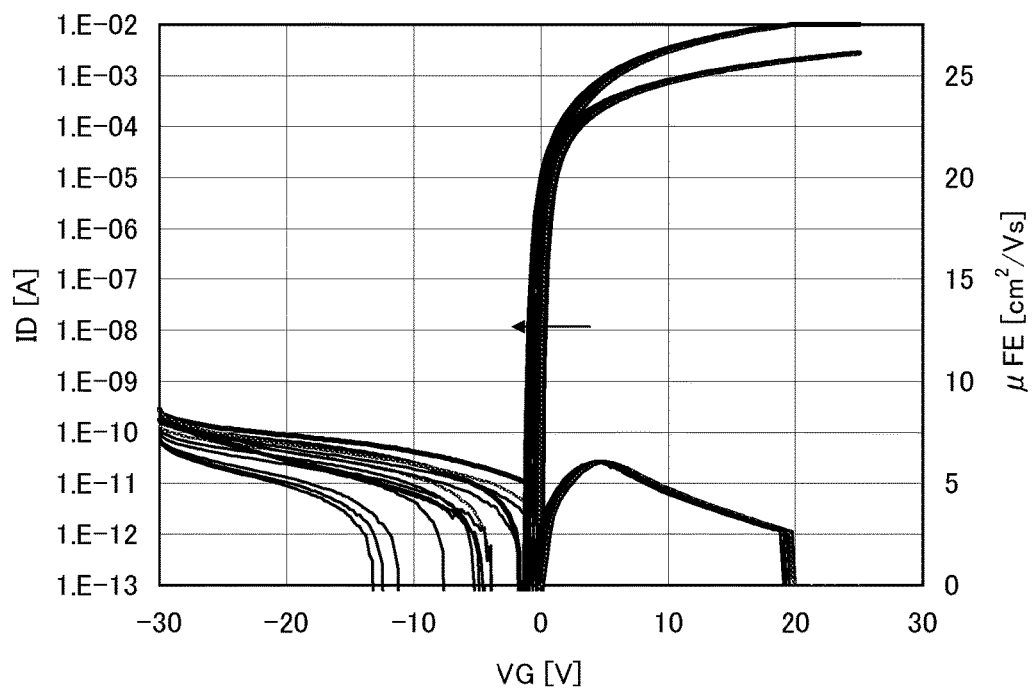

FIG. 9A shows Vg-Id curve after the test of the oxide semiconductor transistor manufactured based on the description of the embodiment. FIG. 9B shows Vg-Id curve of the transistor as the comparative example. In FIGS. 9A and 9B, the test was performed on the transistors with a gate voltage −30V applied for a maximum of 2000 seconds. The other test conditions are the same as those in FIGS. 8A and 8B.

In FIGS. 9A and 9B, as in FIGS. 8A and 8B, rising of a drain current (Id) at the gate voltage (Vg) of 0V changes in the transistor as the comparative example, but rising of a drain current (Id) at the gate voltage (Vg) of 0V is substantially uniform in the oxide semiconductor transistor manufactured based on the description of the embodiment.

This example shows that a transistor having stable electrical characteristics can be obtained according to an embodiment of the disclosed invention.

When a semiconductor device is formed using the transistor in which electrical characteristics are stable as described above, a highly reliable semiconductor device can be obtained.

This application is based on Japanese Patent Application serial no. 2011-017082 filed with Japan Patent Office on Jan. 28, 2011, the entire contents of which are hereby incorporated by reference.

What is claimed is:

1. A semiconductor device comprising:
    a first substrate;
    a sealant;
    a circuit including a first transistor over the first substrate;
    a pixel portion including a pixel over the first substrate, the pixel including:
        a second transistor including an oxide semiconductor layer;
        a pixel electrode electrically connected to a drain electrode of the second transistor;
        a capacitor comprising the drain electrode of the second transistor and a first wiring functioning as a capacitor electrode or a capacitor wiring;
        a second wiring functioning as a gate electrode of the second transistor; and
        a third wiring functioning as a source electrode of the second transistor; and
    a second substrate fixed to the first substrate with the sealant,
    wherein the oxide semiconductor layer is provided over an entire surface of the pixel except for a groove portion, and
    wherein the groove portion crosses the first wiring in a line width direction of the first wiring across both edges of the first wiring.

2. The semiconductor device according to claim 1, wherein the second substrate is a glass substrate.

3. The semiconductor device according to claim 1, wherein the first substrate is a semiconductor substrate or a glass substrate.

4. A semiconductor device comprising:
    a first substrate;
    a sealant;
    a circuit including a first transistor over the first substrate;
    a pixel portion including a pixel over the first substrate, the pixel including:
        a second transistor including an oxide semiconductor layer;
        a pixel electrode electrically connected to a drain electrode of the second transistor;
        a capacitor comprising the drain electrode of the second transistor and a first wiring functioning as a capacitor electrode or a capacitor wiring;
        a second wiring functioning as a gate electrode of the second transistor; and
        a third wiring functioning as a source electrode of the second transistor; and
    a second substrate fixed to the first substrate with the sealant,
    wherein the sealant has a first closed shape and a second closed shape,
    wherein a first closed space surrounded by the first closed shape, the first substrate, and the second substrate is in a reduced pressure state or filled with dry air and surrounds the circuit,
    wherein a second closed space surrounded by the second closed shape, the first substrate, and the second substrate is filled with a liquid crystal material and surrounds the pixel portion,
    wherein the oxide semiconductor layer includes at least one of In, Ga and Zn,
    wherein the oxide semiconductor layer is provided over an entire surface of the pixel except for a groove portion,
    wherein the groove portion crosses the first wiring in a line width direction of the first wiring across both edges of the first wiring,
    wherein the groove portion crosses the second wiring in a line width direction of the second wiring across both edges of the second wiring, and
    wherein the groove portion is along a direction parallel to a direction in which the third wiring extends.

5. The semiconductor device according to claim 4, wherein the second substrate is a glass substrate.

6. The semiconductor device according to claim 4, wherein the first substrate is a semiconductor substrate or a glass substrate.

* * * * *